(12) United States Patent
Hoogenraad et al.

(10) Patent No.: US 6,795,164 B2
(45) Date of Patent: Sep. 21, 2004

(54) LITHOGRAPHIC APPARATUS, DEVICE MANUFACTURING METHOD, AND DEVICE MANUFACTURED THEREBY

(75) Inventors: Johannes Herman Hoogenraad, Houten (NL); Vasudeva Nayak Puttur, Eindhoven (NL)

(73) Assignee: ASML Netherlands B.V. (NL)

( * ) Notice: Subject to any disclaimer, the term of this patent is extended or adjusted under 35 U.S.C. 154(b) by 19 days.

(21) Appl. No.: 10/198,082

(22) Filed: Jul. 19, 2002

(65) Prior Publication Data

US 2003/0025891 A1 Feb. 6, 2003

(30) Foreign Application Priority Data

Jul. 20, 2001 (EP) .............................. 01306260

(51) Int. Cl.[7] ........................ G03B 27/42; G03B 27/58; G03B 27/62
(52) U.S. Cl. ............................. 355/53; 355/72; 355/75
(58) Field of Search ............................ 355/53, 72, 75; 702/150, 151, 155

(56) References Cited

U.S. PATENT DOCUMENTS

| | | | | |
|---|---|---|---|---|
| 4,457,664 A | * | 7/1984 | Judell et al. ................ | 414/779 |
| 5,444,245 A | * | 8/1995 | Kitamura .................... | 250/307 |
| 5,497,007 A | * | 3/1996 | Uritsky et al. ............ | 250/491.1 |
| 5,825,913 A | * | 10/1998 | Rostami et al. ............. | 382/151 |
| 6,195,619 B1 | | 2/2001 | Ren | |
| 6,629,053 B1 | * | 9/2003 | Mooring ....................... | 702/94 |
| 2002/0164077 A1 | * | 11/2002 | Lee et al. .................... | 382/224 |

FOREIGN PATENT DOCUMENTS

| | | |
|---|---|---|
| JP | 9-90308 | 4/1997 |
| JP | 9-152569 | 6/1997 |

OTHER PUBLICATIONS

A copy of the European Search Report dated Jan. 7, 2002, issued in the corresponding European Application No. EP 01 30 6260.

* cited by examiner

Primary Examiner—Rodney Fuller
(74) Attorney, Agent, or Firm—Pillsbury Winthrop LLP (57) ABSTRACT

A prealignment system is configured to determine a position and orientation of a substrate (e.g. a polygonal substrate). The system rotates a substrate about an axis of rotation that is substantially perpendicular to the plane of the substrate. The system also includes a non-contact edge sensor configured to indicate, at each of a plurality of angles of rotation of the substrate, a corresponding distance of an edge of the substrate along a line intersecting the axis of rotation. The system also determines, based on the plurality of distances, best-fit lines for at least two edges of the substrate, and determines a position and orientation of the substrate based on the best-fit lines.

20 Claims, 6 Drawing Sheets

LITHOGRAPHIC APPARATUS, DEVICE MANUFACTURING METHOD, AND DEVICE MANUFACTURED THEREBY

This application claims priority to European Patent Application EP 01306260.9 filed Jul. 20, 2001, which document is herein incorporated by reference.

FIELD OF THE INVENTION

The present invention relates to lithographic projection apparatus and methods.

BACKGROUND

The term "patterning structure" as here employed should be broadly interpreted as referring to any structure or field that may be used to endow an incoming radiation beam with a patterned cross-section, corresponding to a pattern that is to be created in a target portion of a substrate; the term "light valve" can also be used in this context. Generally, such a pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of very small (possibly microscopic) mirrors, each of which can be individually tilted about an axis by applying a suitable localized electric field, or by employing piezoelectric actuation means. For example, the mirrors may be matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. No. 5,296,891 and No. 5,523, 193, which are incorporated herein by reference, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (e.g. a wafer of silicon or other semiconductor material) that has been coated with a layer of radiation-sensitive material (resist). In general, a single wafer will contain a whole network of adjacent target portions that are successively irradiated via the projection system (e.g. one at a time). Among current apparatus that employ patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. A projection beam in a scanning type of apparatus may have the form of a slit with a slit width in the scanning direction. More information with regard to lithographic devices as here described can be gleaned, for example, from U.S. Pat. No. 6,046,792, which is incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

The term "projection system" should be broadly interpreted as encompassing various types of projection system, including refractive optics, reflective optics, and catadioptric systems, for example. For the sake of simplicity, the projection system may hereinafter be referred to as the "lens". The radiation system may also include components operating according to any of these design types for directing, shaping, reducing, enlarging, patterning, and/or otherwise controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT Application No. WO 98/40791, which documents are incorporated herein by reference.

In many lithographic projection apparatus, the substrate (for example, a wafer) must be delivered to the substrate table within a predetermined range from a predetermined position and with a known translational and rotational offset from the predetermined position. This delivery is typically performed by a pre-alignment unit (or "prealigner") which is part of a wafer handling system. The prealigner determines the orientation of the wafer with respect to the prealigner, positions the wafer such that it will arrive at the wafer table within specification, and determines what the remaining offset from the predetermined position will be.

It has previously been known to pre-align wafers by mechanically pressing one edge or corner of the wafer against a known surface or pair of surfaces. However, this method is relatively slow and may introduce contamination to the wafer. Additionally, the accuracy achievable by such a method may be relatively low. Factors such as wear and wafer expansion may further reduce the accuracy, and the method can result in chipping of the edge of the wafer, which may also further reduce the accuracy. This method cannot detect notches (e.g. which may be used to mark orientation of the wafer) and is also typically limited in the range of wafer sizes that can be handled.

SUMMARY

A prealignment system according to one embodiment of the invention is configured to determine a position and orientation of a substrate (e.g. a polygonal substrate). The system includes means for rotating a substrate about an axis of rotation that is substantially perpendicular to the plane of the substrate. The system also includes a non-contact edge sensor configured to indicate, at each of a plurality of angles of rotation of the substrate, a corresponding distance of an edge of the substrate along a line intersecting the axis of rotation. Means are also provided for determining, based on the plurality of distances, best-fit lines for at least two edges of the substrate, and for determining a position and orientation of the substrate based on the best-fit lines.

A lithographic projection apparatus according to another embodiment of the invention includes a prealignment system as described above.

A device manufacturing method according to an embodiment of the invention includes using a radiation system to provide a projection beam of radiation, using patterning structure to endow the projection beam with a pattern in its cross-section, and projecting the patterned beam of radiation onto a target portion of a layer of radiation-sensitive material that at least partially covers a substrate on an object table. The method includes, prior to projecting the patterned beam of radiation onto the target portion, determining a position and orientation of the substrate. In this embodiment, determining a position and orientation of the substrate includes rotating the substrate about an axis of rotation substantially perpendicular to the plane of the substrate; indicating, at each of a plurality of angles of rotation of the substrate, a corresponding distance of an edge of the substrate along a line intersecting the axis of rotation; determining, based on the plurality of distances, best-fit lines for at least two major edges of the substrate; and determining the position and orientation of the substrate based on the determined best-fit lines.

Embodiments of the invention also include computer programs for calculating a position and orientation of a substrate, and computer programs for operating a lithographic projection apparatus. For example, a data storage medium (e.g. a magnetic or optical storage medium such as a disk; a volatile and/or nonvolatile memory unit such as RAM, DRAM, SDRAM, ROM, or flash; etc.) according to one embodiment of the invention has machine-readable code, the machine-readable code including instructions executable by an array of logic elements, said instructions defining a method of calculating a position and orientation of a substrate. In this embodiment, calculating a position and orientation of the substrate includes rotating the substrate about an axis of rotation substantially perpendicular to the plane of the substrate; indicating, at each of a plurality of angles of rotation of the substrate, a corresponding distance of an edge of the substrate along a line intersecting the axis of rotation; determining, based on the plurality of distances, best-fit lines for at least two major edges of the substrate; and determining the position and orientation of the substrate based on the determined best-fit lines.

Although specific reference may be made in this text to the use of an apparatus according to an embodiment of the invention in the manufacture of ICs, it should be explicitly understood that such an apparatus may have many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and extreme ultra-violet (EUV) radiation (e.g. having a wavelength in the range 5–20 nm, especially around 13 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Embodiments of the invention include, for example, a method and apparatus of pre-aligning polygonal substrates which avoids the risk of damage caused by chipping and is faster and more accurate than conventional methods. While optical and other non-contact (e.g. capacitive) pre-alignment methods have been applied to round wafers, such techniques have previously not been applicable to polygonal (e.g. square or rectangular) wafers.

Figure 1:
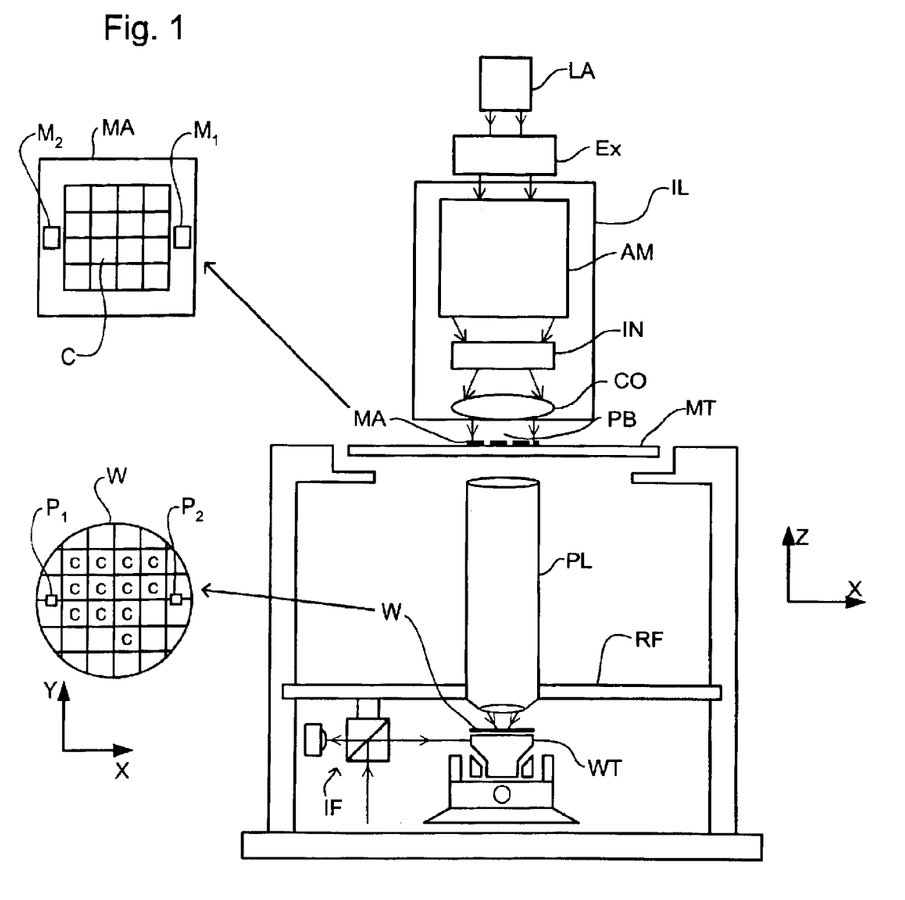
FIG. 1 depicts a lithographic projection apparatus according to an embodiment of the invention.

FIG. 1 schematically depicts a lithographic projection apparatus according to a particular embodiment of the invention. The apparatus comprises:

- A radiation system configured to supply (e.g. having structure capable of supplying) a projection beam of radiation. In this particular example, the radiation system Ex, IL, for supplying a projection beam PB of radiation (e.g. UV or EUV radiation) also comprises a radiation source LA;
- A support structure configured to support a patterning structure capable of patterning the projection beam. In this example, a first object table (mask table) MT is provided with a mask holder for holding a mask MA (e.g. a reticle), and is connected to a first positioning structure for accurately positioning the mask with respect to item PL;
- A second object table (substrate table) configured to hold a substrate. In this example, substrate table WT is provided with a substrate holder for holding a substrate W (e.g. a resist-coated silicon wafer), and is connected to a second positioning structure for accurately positioning the substrate with respect to item PL; and
- A projection system ("lens") configured to project the patterned beam. In this example, projection system PL (e.g. a lens group, a catadioptric or catoptric system, and/or a mirror system) is configured to image an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning structure, such as a programmable mirror array of a type as referred to above.

The source LA (e.g. a mercury lamp, an excimer laser, an electron gun, a laser-produced plasma source or discharge plasma source, or an undulator provided around the path of an electron beam in a storage ring or synchrotron) produces a beam of radiation. This beam is fed into an illumination system (illuminator) IL, either directly or after having traversed a conditioning structure or field, such as a beam expander Ex, for example. The illuminator IL may comprise an adjusting structure or field AM for setting the outer and/or inner radial extent (commonly referred to as σ-outer and σ-inner, respectively) of the intensity distribution in the beam, which may affect the angular distribution of the radiation energy delivered by the projection beam at, for example, the substrate. In addition, the apparatus will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable direction mirrors); this latter scenario is often the case when the source LA is an excimer laser. The current invention and claims encompass both of these scenarios.

The beam PB subsequently intercepts the mask MA, which is held on a mask table MT. Having traversed (alternatively, having been selectively reflected by) the mask MA, the beam PB passes through the lens PL, which focuses the beam PB onto a target portion C of the substrate W. With the aid of the second positioning structure (and interferometric measuring structure IF), the substrate table WT can be moved accurately, e.g. so as to position different target portions C in the path of the beam PB. Similarly, the first positioning structure can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected at once (i.e. in a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The apparatus further comprises a prealigner. It may be desirable to mechanically isolate the prealigner from the substrate table (e.g. in order to prevent vibrations from being transferred from the prealigner to the substrate table). In this example, a substrate handler (such as a wafer handler robot) is used to deliver the wafer to the prealigner, and a substrate handler subsequently transfers the wafer to the substrate table WT. The two substrate handlers may be the same one or may be two different substrate handlers. In order to ensure that placement accuracy is not lost, a substrate handler may be in a fixed position relative to the prealigner. Alternatively, the substrate handler may be mechanically isolated from the prealigner during movement. In this case, the substrate handler will subsequently temporarily couple to the prealigner (e.g. in order to define its position relative to the prealigner) prior to picking up the wafer. An example of such a system can be seen in EP-1 052 548-A2, incorporated herein by reference.

The prealigner can support the wafer, for example, by way of a gas bearing. In such case, only limited mechanical contact may be used to secure the position of the wafer and to move it as required. Such a prealigner can also serve several other functions. For example, the gas used in the gas bearing can be heated or cooled to aid in temperature stabilization of the wafer. The gas may also be charged to gradually discharge any built-up charge on the wafer, and it may be filtered to be used to blow away any contaminants on the under side of the wafer. Such uses may reduce the likelihood of damage to the wafer and/or to help improve the positional accuracy. An example of such a prealigner can be seen in EP-1 052 546-A2, incorporated herein by reference.

Figure 2:
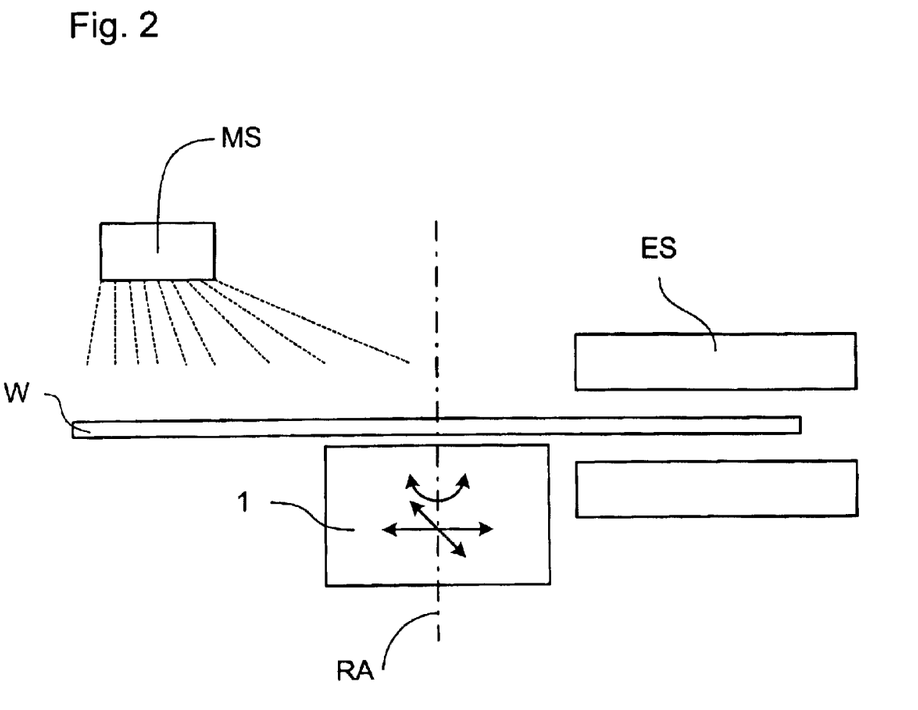
FIG. 2 depicts a schematic representation of a prealignment unit according to an embodiment of the present invention.

As schematically represented in FIG. 2, the prealigner of the present invention comprises a wafer support 1 for rotating a wafer W about an axis RA of the prealigner and for translating the wafer in a plane parallel to the wafer, an edge sensor ES for determining the distance of an edge of the wafer (e.g. from the axis RA) along an axis within the plane of the wafer (hereafter referred to as the radius), and a mark sensor MS for determining the location of marks on the surface of the wafer.

When the wafer W is delivered from the substrate handler to the prealigner, it will be at an arbitrary and unknown position on the wafer support 1. The prealigner must therefore determine the position and orientation of the wafer accurately. In an exemplary application, four co-ordinate systems are used in order to facilitate this. Two of these—the edge sensor co-ordinate system ESCS and the mark sensor co-ordinate system MSCS—are fixed relative to the prealigner. The remaining two—the geometrical wafer co-ordinate system GWCS and the wafer co-ordinate system WCS—are fixed relative to the geometry of the wafer and the marks on the wafer, respectively.

Figure 3A:
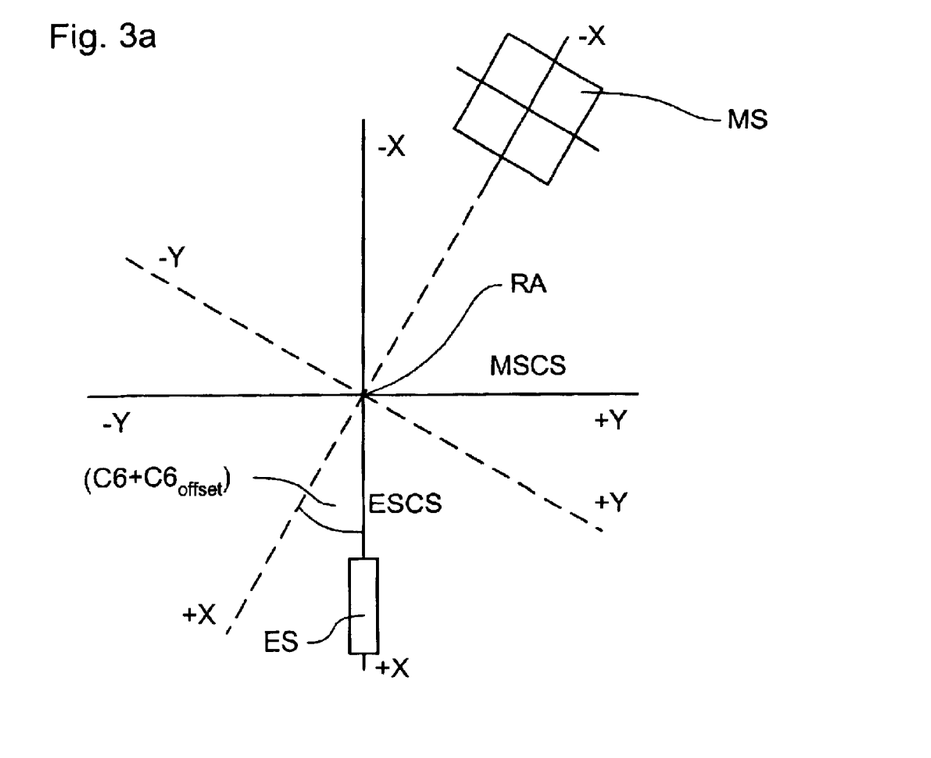
FIG. 3a depicts the relationship between a edge sensor co-ordinate system and a mark sensor co-ordinate system.

FIG. 3a shows the relationship between the edge sensor co-ordinate system ESCS and the mark sensor co-ordinate system MSCS. The edge sensor co-ordinate system is defined by its X-axis, which is the line passing through the axis of rotation RA of the prealigner and the pixel of the edge sensor ES that is furthest from the axis of rotation RA. The Y-axis is the line perpendicular to the X-axis, also passing through the axis of rotation RA of the prealigner. Both of these axes are in the plane of the wafer when loaded on the prealigner. The X-axis of the mark sensor co-ordinate system is the line passing through the axis of rotation RA of the prealigner and a set point on the mark sensor MS.

The mark sensor MS is arranged such that the respective axes of the edge sensor co-ordinate system and the mark sensor co-ordinate system are at a predetermined angle C6 (for example, 60°). In practice, because of the mounting tolerances of the edge sensor ES and the mark sensor MS, there is a small offset in C6 (designated as $C6_{offset}$). Therefore, the total angle between the axes is $C6+C6_{offset}$. The value of $C6_{offset}$ may be determined during calibration procedures.

Figure 3B:
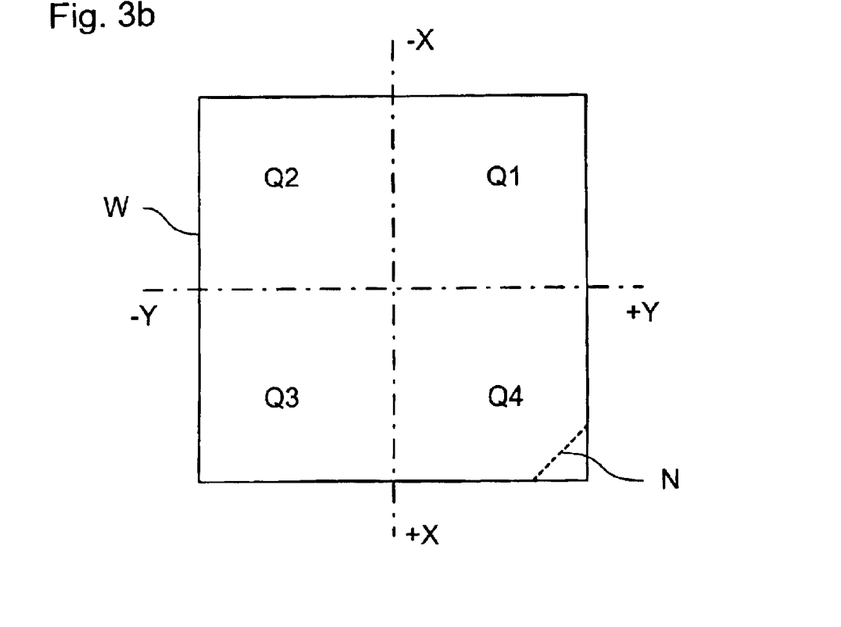
FIG. 3b depicts a geometrical wafer co-ordinate system.

FIG. 3b shows the geometrical wafer co-ordinate system GWCS. The axes of the GWCS are parallel to the edges of the wafer W, which is square in this example but may be rectangular or otherwise polygonal in general. The origin of the GWCS is the geometrical center of the wafer. If a notch N is present, it will, for example, be in the fourth quadrant Q4 of the co-ordinate system. The wafer co-ordinate system WCS is defined by the position of specific marks, such as fiducials on the surface of the wafer. Therefore, there may be an offset between the geometrical wafer co-ordinate system and the wafer co-ordinate system, which will remain constant for each individual wafer.

Figure 4:
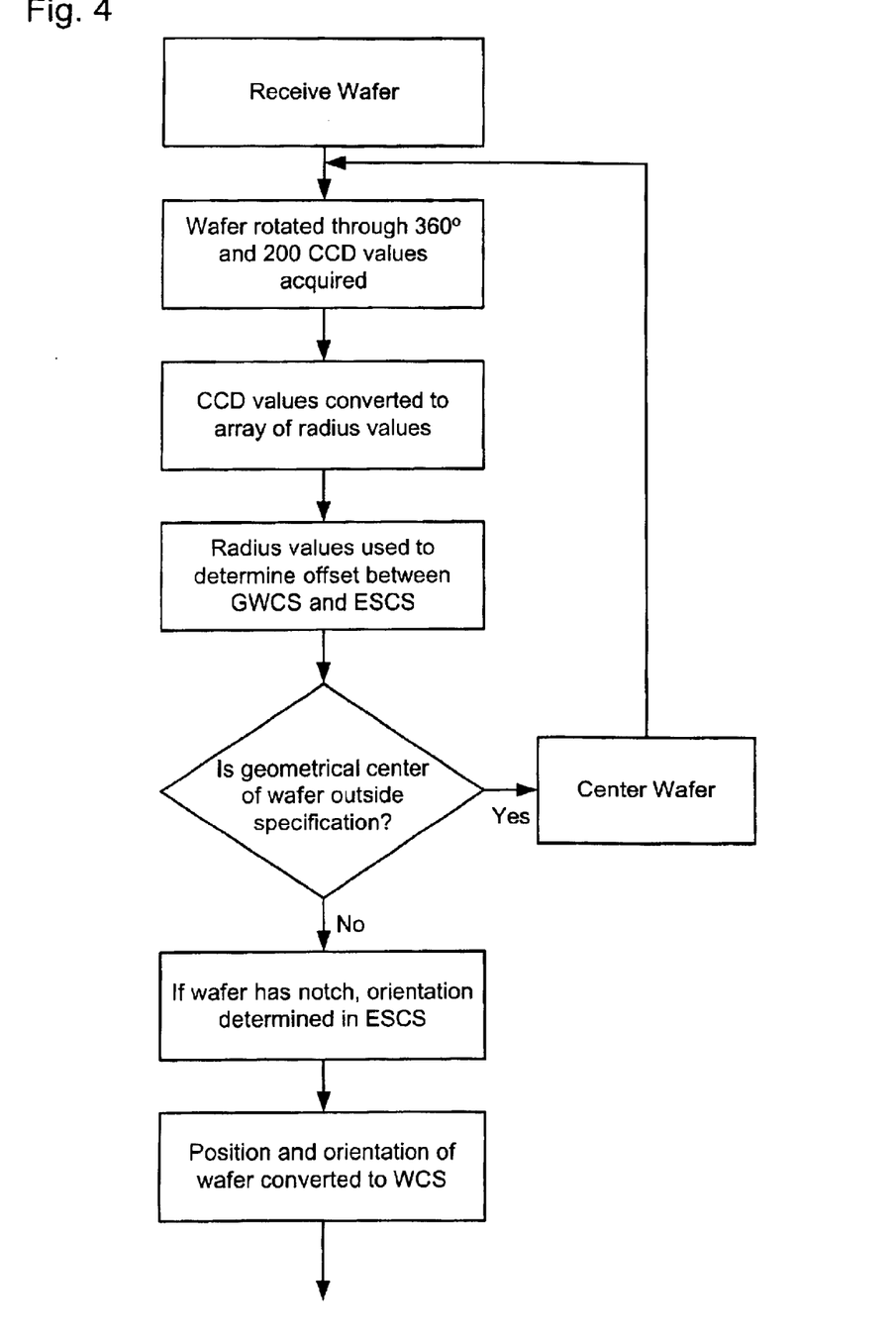
FIG. 4 shows a flowchart of tasks used to determine the position and orientation of the wafer in the prealigner in a method according to an embodiment of the invention.

FIG. 4 shows a flowchart of tasks that may be used to determine the position and orientation of the wafer W in the prealigner. After the wafer has been received in the prealigner, it is rotated through 360°. During this rotation, two hundred values are obtained from the edge sensor ES. In this embodiment, edge sensor ES is a Charge Coupled Device, and the two hundred values are also referred to as CCD values. It will be apparent that the invention is not limited to the use of two hundred CCD values and that more or fewer CCD values could also be obtained. Additionally, rotation through an angle between 180 and 360 degrees, or even less than 180 degrees, may be sufficient in some circumstances. Moreover, other implementations may include other non-contact edge sensors (e.g. capacitive) in addition to or in place of optical (e.g. CCD or CMOS, sensing visible and/or nonvisible light) sensors.

Each CCD value indicates a distance, along a line intersecting axis RA, of the point on the edge of the wafer that was determined by the edge sensor ES. For example, the distance may be relative to the intersection point of RA with the wafer, or to a circle of fixed radius in the plane of the wafer and centered at axis RA (e.g. such circle being associated with an end of edge sensor ES closest to axis RA).

The CCD values are then converted into an array of radius values, each radius value being associated with the angle at which the measurement was taken and indicating the distance from the corresponding edge point to the intersection of RA with the wafer. Each measurement point on the edge of the wafer is therefore characterized by a polar co-ordinate in the edge sensor co-ordinate system. The conversion and/or subsequent processing may be performed by a processing unit (e.g. one or more microprocessors, embedded processors, application-specific integrated circuits, field-programmable gate arrays, and/or other arrays of logic elements configured to execute coded instructions).

Figure 5:
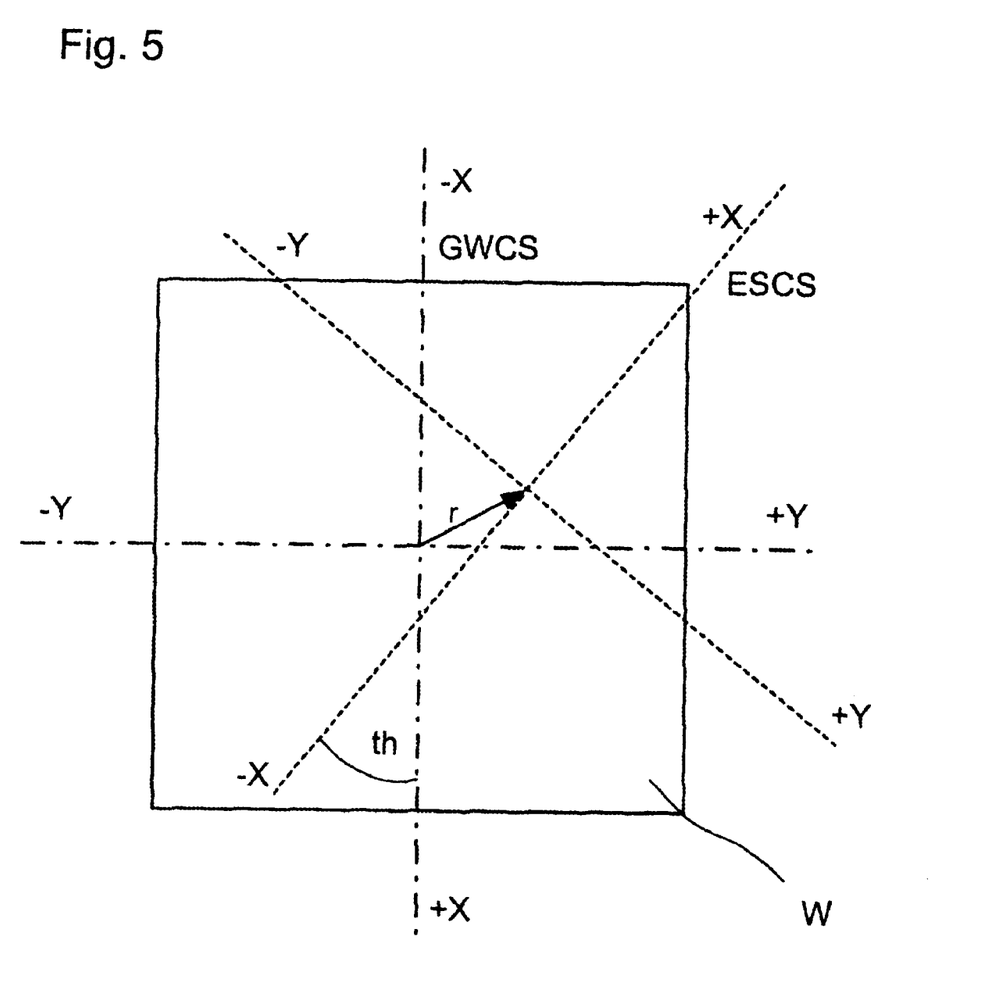
FIG. 5 shows a offset between an edge sensor co-ordinate system and a geometrical wafer co-ordinate system.

From these values, the relationship (or "offset vector") between the edge sensor co-ordinate system and the geometric wafer co-ordinate system can be determined (see below, e.g. in discussion of FIG. 6). As shown in FIG. 5, this relationship can be characterized by the distance r between the origins of the two co-ordinate systems and the angle th by which ESCS is rotated from the GWCS. For clarity, r will be denoted GWCS_ESCS_r_offset, and th will be denoted GWCS_ESCS_th_offset.

A determination can then be made to see if the wafer W is within the specified range of acceptable locations. For example, GWCS_ESCS_r_offset may be compared to a preset threshold value. The acceptable offset may be, for example, within 0.5 mm. If the wafer is not within the specified limits, the wafer may be moved (e.g. using the wafer support) in order to re-center it, and the measurement steps may be repeated for the new location. This cycle can be repeated as often as necessary in order to position the wafer within the specified range of locations.

If the wafer has a notch N, then the orientation of the notch in the edge sensor co-ordinate system ESCS may be determined (described further below). It is possible, however, that the notch orientation may be performed in advance of the pre-alignment. The orientation of the notch within the edge sensor co-ordinate system, GWCS_ESCS_theta, is the notch orientation as found within the geometric wafer co-ordinate system GWCS, combined with the value GWCS_ESCS_th_offset.

It is frequently more convenient to have these orientations in the mark sensor co-ordinate system. The angles may be converted as follows:

GWCS_MSCS_theta=GWCS_ESCS_theta+(C6+ C6$_{offset}$)

GWCS_MSCS_th_offset=GWCS_ESCS_th_offset+ (C6+C6$_{offset}$)

Note that, since the origins of the mark sensor co-ordinate system and the edge sensor co-ordinate system coincide:

GWCS_MSCS_r_offset=GWCS_ESCS_r_offset

In order to specify the position and orientation of the features on the wafer W (in the mark sensor co-ordinate system), the WCS_GWCS_offset vector (i.e. the difference between the geometrical wafer co-ordinate system and the wafer co-ordinate system) is added to the vector position of the geometric center of the wafer in the mark sensor co-ordinate system (i.e. a vector of length GWCS_MSCS_r_offset, at angle GWCS_MSCS_th_offset). The orientation of the features on the wafer is the sum of the WCS_GWCS_offset vector angle and GWCS_MSCS_theta.

Figure 6:
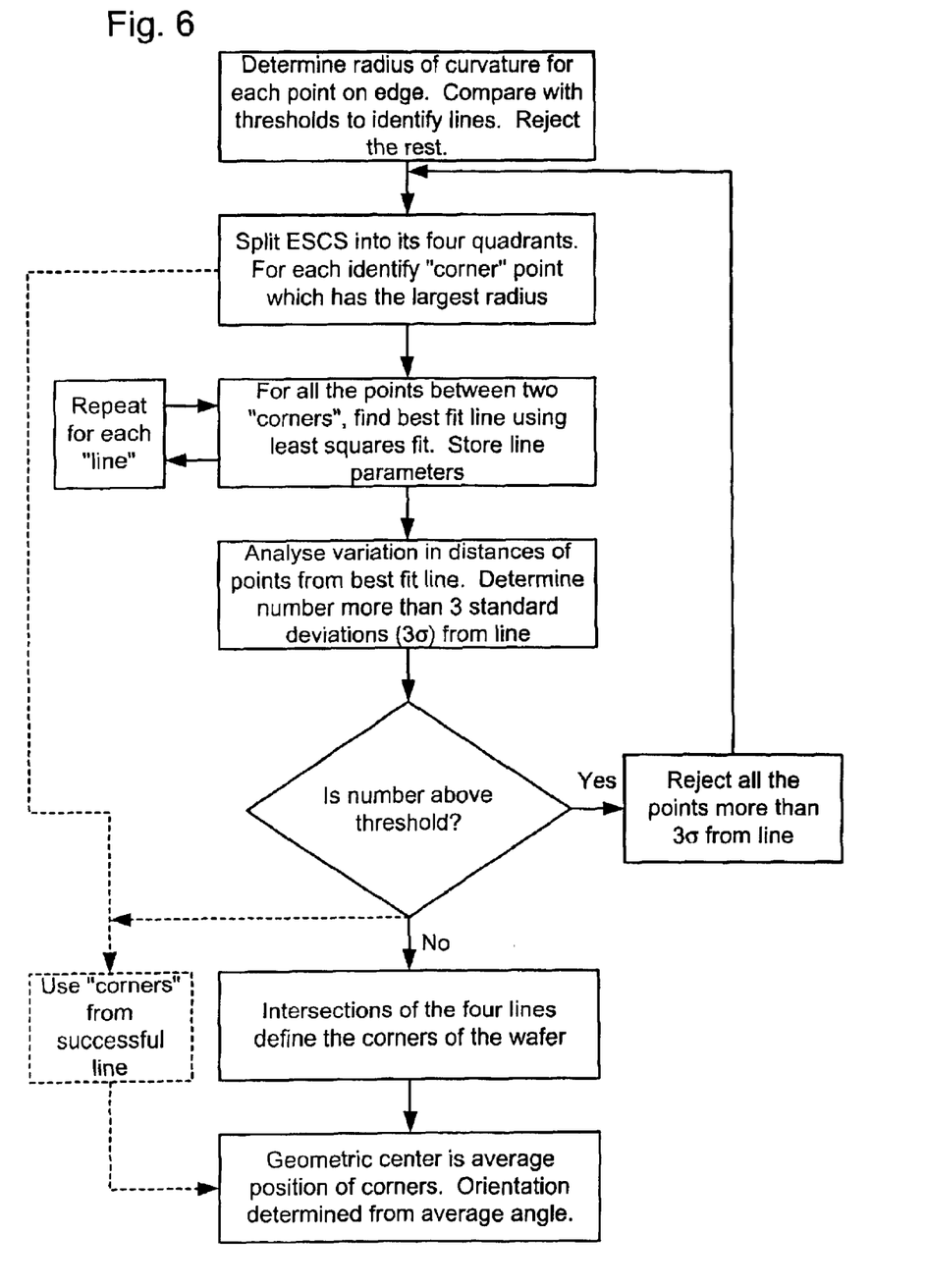
FIG. 6 shows a flowchart of tasks used to determine the offset between an edge sensor co-ordinate system and an geometrical wafer co-ordinate system in a method according to an embodiment of the invention.

FIG. 6 shows a flowchart of tasks that may be used to determine the vector offset between the geometric wafer co-ordinate system and the edge sensor co-ordinate system. The first task includes estimating the radius of curvature of the edge of the wafer for each measured point on the edge of the wafer. This estimate can be calculated using the points on either side and fitting a circle to the three points. The measurement points are then classified as "line", "circle", or "other" by comparing the radius of curvature values to pre-set thresholds. In this example, those points which are not classified as "lines" are rejected at this stage.

Next, the edge sensor co-ordinate system ESCS is split into its four quadrants, and the measurement points in each quadrant are compared. Assuming that the wafer is not offset by more than a quarter of the width of the wafer (i.e. by more than the size of a single quadrant), each of the quadrants will contain one of the corners of the wafer. The measurement point in each quadrant which has the largest radius value is therefore considered to be a "corner point". Once the four "corners" have been identified, the remaining measurement points between adjacent corners, forming a line, will be considered to be those on one edge of the wafer.

The measurement points are converted to Cartesian co-ordinates within the edge sensor co-ordinate system ESCS. A best-fit line of the form y=AX+b is then determined for each of the edge lines using a standard least-squares method. The variation of the distances of the points in each edge line from the best-fit line is then analyzed. Any points which are more than three standard deviations from the line are rejected. If the number of points rejected in this step exceeds a threshold (for example, if any points are rejected), then the procedure is repeated without the rejected points, from the point where the "corners" were determined, until the number of points rejected in this step is below the threshold.

Once the four edge lines have been found in this manner, the lines are extrapolated and the four points where they meet (that are closest to the origin and/or are closer to the origin than a predetermined distance—i.e. ignore the more distant intersections where the approximately parallel lines intersect) define the corners of the wafer W. Note if the wafer has a notch, then at the notched corner, the corner may be determined to be where the corner would have been if there was no notch.

Alternatively, the corners used may be the "corners" found at the maximum radius in each quadrant in the successful procedure to find the edge lines. In this case, it is not necessary to find all four corners. If one corner is not recognizable, it may be deduced from the position of the other corners.

The four corners can then be used to find the offset vector between the edge sensor co-ordinate system ESCS and the geometrical wafer co-ordinate system GWCS. The average of the positions of the corners is the geometrical center of the wafer (which is the origin of the geometrical wafer co-ordinate system). This operation therefore defines r, also referred to above as the GWCS_ESCS_r_offset. The average of the angle of orientation of each of the lines connecting the corners will be th+45°, where th is the angle by which ESCS is rotated from the GWCS, referred to above as GWCS_ESCS_th_offset.

A square wafer may be limited to have a notch present on only one of the four corners. Therefore, assuming that the wafer is limited such that the side of the wafer to be exposed has a predetermined direction, the orientation of the notch of a square wafer can be determined simply by determining on which of the corners the notch is located. The radius of curvature values, which may have been determined in a previous step or may be determined at this point, can be used to determine whether an identified corner has a notch or not. Thresholds can be set for the size of a notch, e.g. in order to prevent spurious identification of false notches which may be caused by damage to corners.

The detection of the notch may be carried out after the prealigner has determined the position and orientation of the wafer. Alternatively, detection of the notch may be performed in a pre-prealignment step. In this case, a fast scan is made of the wafer in order to determine the position of the notch. This operation is then followed by the accurate wafer centering and position and orientation determination. In some embodiments (e.g. using pre-orientated wafers without notches), the original orientation of the wafer is preserved and the notch detection step is not performed.

An apparatus according to an embodiment of the invention may also include a transport means for positioning the substrate on the substrate table. For example, such a transport means may apply the determined position and orientation of the substrate in order to position the substrate on the substrate table within a predetermined range from a predetermined position and with a known translational and rotational offset from the predetermined position.

Advantages that may be realized in the use of apparatus according to certain embodiments of the invention include minimizing the risk of damage to the edges of a substrate during the pre-alignment process without requiring the substrate to have any rotational symmetry.

Additionally, certain such apparatus may be able to accurately determine the position and orientation of the substrate even if the corners are damaged or one has a notch. For example, an apparatus that determines a position and orientation of the substrate by establishing the position of at least one corner of the substrate from the intersecting of two of the best-fit lines may be able to determine where the corner would have been, even in a case where the substrate is damaged, such that the position and orientation of the substrate may be accurately determined despite the substrate being damaged.

The method described above has been for a substrate with four sides and four corners (one of which may be notched), namely a square or rectangular substrate. It will be appreciated, however, that the method can be adapted for use with other polygonal substrates by, for example, determining a different number of "corner points" (e.g. in a different number of "quadrants" or regions) and finding best-fit lines for the points in between.

Whilst specific embodiments of the invention have been described above, it will be appreciated that the invention as claimed may be practiced otherwise than as described. It is explicitly noted that the description of these embodiments is not intended to limit the invention as claimed.

We claim:

1. A prealignment system configured to determine a position and orientation of a substrate, said system comprising:
    a wafer support configured to rotate a substrate about an axis of rotation that is substantially perpendicular to the plane of the substrate;
    a non-contact edge sensor configured to indicate, at each of a plurality of angles of rotation of the substrate, a corresponding distance of an edge of the substrate along a line intersecting the axis of rotation; and
    a processing unit configured to determine, based on the plurality of distances, best-fit lines for at least two edges of the substrate and to determine
    a position and orientation of the substrate based on the best-fit lines.

2. The prealignment system according to claim 1, wherein the substrate has a polygonal outline in its plane.

3. The prealignment system according to claim 2, wherein the substrate is quadrilateral in its plane.

4. The prealignment system according to claim 1, wherein the processing unit is further configured to calculate, based on the intersection of two of the best-fit lines, the position of at least one corner of the substrate.

5. The prealignment system according to claim 1, wherein the processing unit
    is further configured to estimate a radius of curvature at a plurality of edge points of the substrate by fitting a circle to an edge point and the edge points adjacent on either side, each edge point corresponding to one of the plurality of angles;
    to identify, from among the plurality of edge points and based on the radius-of-curvature estimates, edge points that are associated with corners of the substrate; and
    to determine a best-fit line for edge points between an adjacent pair of the edge points associated with corners.

6. The prealignment system according to claim 1, wherein the wafer support is configured to rotate the substrate through 360 degrees, and
    wherein the non-contact edge sensor is configured to determine the distance of the edge of the substrate a predetermined number of times during the 360-degree rotation.

7. The prealignment system according to claim 1, wherein the non-contact edge sensor includes an optical edge sensor.

8. A lithographic projection apparatus configured to image a pattern onto a substrate, said apparatus comprising:
    a radiation system configured to provide a projection beam of radiation;
    a support structure configured to support a patterning structure capable of patterning the projection beam according to a desired pattern;
    a substrate table for holding a polygonal, planar substrate;
    a projection system configured to project the patterned beam onto a target portion of the substrate, said projection system including a plurality of optical elements configured to control the patterned beam; and
    a prealignment system including:
        a wafer support configured to rotate the substrate about an axis of rotation that is substantially perpendicular to the plane of the substrate;
        a non-contact edge sensor configured to indicate, at each of a plurality of angles of rotation of the substrate, a corresponding distance of an edge of the substrate along a line intersecting the axis of rotation; and
        a processing unit configured to determine, based on the plurality of distances, best-fit lines for at least two edges of the substrate and
        to determine a position and orientation of the substrate based on the best-fit lines.

9. The lithographic projection apparatus according to claim 8, said system further comprising a transport unit configured to transport the substrate from the prealignment system to the substrate table,
    wherein the transport unit is further configured to use an output of the processing unit to position the substrate on the substrate table within a predetermined range from a predetermined position and with a determined translational and rotational offset from the predetermined position.

10. A device manufacturing method, said method comprising:
    using a radiation system to provide a projection beam of radiation;
    using patterning structure to endow the projection beam with a pattern in its cross-section;
    projecting the patterned beam of radiation onto a target portion of a layer of radiation-sensitive material that at least partially covers a substrate on an object table;
    prior to projecting the patterned beam of radiation onto the target portion, determining a position and orientation of the substrate, said determining including:
        rotating the substrate about an axis of rotation substantially perpendicular to the plane of the substrate;
        indicating, at each of a plurality of angles of rotation of the substrate, a corresponding distance of an edge of the substrate along a line intersecting the axis of rotation;
        determining, based on the plurality of distances, best-fit lines for at least two major edges of the substrate; and
        determining the position and orientation of the substrate based on the determined best-fit lines.

11. The device manufacturing method according to claim 10, wherein the substrate has a polygonal outline in its plane.

12. The device manufacturing method according to claim 11, wherein the substrate is quadrilateral in its plane.

13. The device manufacturing method according to claim 10, wherein determining a position and orientation of the substrate includes calculating, based on the intersection of two of the best-fit lines, the position of at least one corner of the substrate.

14. The device manufacturing method according to claim 10, wherein determining best-fit lines includes:

estimating a radius of curvature at a plurality of edge points of the substrate by fitting a circle to an edge point and the edge points adjacent on either side, each edge point corresponding to one of the plurality of angles;

identifying, from among the plurality of edge points and based on the radius-of-curvature estimates, edge points that are associated with corners of the substrate; and determining a best-fit line for edge points between an adjacent pair of the edge points associated with corners.

15. A device manufactured according to the device manufacturing method of claim 10.

16. A data storage medium having machine-readable code, the machine-readable code including instructions executable by an array of logic elements, said instructions defining a method of calculating a position and orientation of a substrate, said method comprising:

receiving a plurality of first data elements, each first data element indicating an angle of rotation of the substrate about the axis of rotation of the prealignment system;

receiving a corresponding plurality of second data elements from a non-contact edge sensor, each second data element indicating a distance of an edge of the substrate along a line intersecting the axis of rotation at an angle indicated by the corresponding first data element;

calculating, based on the pluralities of first and second data elements, best-fit lines for at least two major edges of the substrate; and calculating, based on the best-fit lines, a position and orientation of the substrate.

17. The data storage medium according to claim 16, wherein the substrate has a polygonal outline in its plane.

18. The data storage medium according to claim 16, said method further comprising using the calculated position and orientation of the substrate to control a transport means for positioning the substrate on a substrate table within a predetermined range of positions and orientations and with a known offset.

19. The data storage medium according to claim 16, wherein calculating a position and orientation of the substrate includes calculating, based on the intersection of two of the best-fit lines, the position of at least one corner of the substrate.

20. A prealignment system configured to determine a position and orientation of a substrate, said system comprising:

means for rotating a substrate about an axis of rotation that is substantially perpendicular to the plane of the substrate;

a non-contact edge sensor configured to indicate, at each of a plurality of angles of rotation of the substrate, a corresponding distance of an edge of the substrate along a line intersecting the axis of rotation; and means for determining, based on the plurality of distances, best-fit lines for at least two edges of the substrate; and means for determining a position and orientation of the substrate based on the best-fit lines.

* * * * *